(12) United States Patent
Ishida et al.

(10) Patent No.: US 10,219,372 B2
(45) Date of Patent: Feb. 26, 2019

(54) FLEXIBLE PRINTED BOARD

(71) Applicant: FUJIKURA LTD., Tokyo (JP)

(72) Inventors: Yuki Ishida, Tokyo (JP); Yusuke Nakatani, Sakura (JP)

(73) Assignee: FUJIKURA LTD., Tokyo (JP)

( * ) Notice: Subject to any disclaimer, the term of this patent is extended or adjusted under 35 U.S.C. 154(b) by 128 days.

(21) Appl. No.: 14/907,613

(22) PCT Filed: Jul. 25, 2014

(86) PCT No.: PCT/JP2014/069648
§ 371 (c)(1),
(2) Date: Jan. 26, 2016

(87) PCT Pub. No.: WO2015/012380
PCT Pub. Date: Jan. 29, 2015

(65) Prior Publication Data
US 2016/0183366 A1 Jun. 23, 2016

(30) Foreign Application Priority Data

Jul. 26, 2013 (JP) .................................. 2013-155270
Sep. 26, 2013 (JP) .................................. 2013-200337

(51) Int. Cl.
*H05K 1/02* (2006.01)
*H05K 3/36* (2006.01)
(Continued)

(52) U.S. Cl.
CPC ........... *H05K 1/0296* (2013.01); *H05K 1/028* (2013.01); *H05K 1/118* (2013.01); *H05K 3/361* (2013.01);
(Continued)

(58) Field of Classification Search
None
See application file for complete search history.

(56) References Cited

U.S. PATENT DOCUMENTS 4,958,050 A * 9/1990 Oku ....................... H05K 1/118
174/261
5,737,053 A * 4/1998 Yomogihara ....... G02F 1/13452
349/149
(Continued)

FOREIGN PATENT DOCUMENTS

JP 1-167074 U 11/1989
JP 4-40562 U 4/1992
(Continued)

OTHER PUBLICATIONS

International Search Report dated Sep. 9, 2014, issued in counterpart application No. PCT/JP2014/069648, with English translation (4 pages).
(Continued)

*Primary Examiner* — Courtney Smith
*Assistant Examiner* — Jessey R Ervin
(74) *Attorney, Agent, or Firm* — Westerman, Hattori, Daniels & Adrian, LLP

(57) ABSTRACT

A flexible printed board electrically connected to an electronic component (for example, a liquid crystal panel) by thermal compression bonding, including a flexible substrate, a terminal portion formed on one surface of the flexible substrate and having a plurality of connection terminals to be connected to the electronic component, a wire portion having a plurality of wires formed on the other surface of the flexible substrate, and a plurality of through wires formed inside through holes penetrating the flexible substrate in a compression bonding connection area to the electronic component of the terminal portion to connect the connection terminals of the terminal portion and the respective wires of the wire portion.

6 Claims, 6 Drawing Sheets

(51) Int. Cl.
  *H05K 1/11* (2006.01)
  *H05K 1/14* (2006.01)
(52) U.S. Cl.
  CPC .............. *H05K 1/113* (2013.01); *H05K 1/147* (2013.01); *H05K 2201/09063* (2013.01); *H05K 2201/09481* (2013.01); *H05K 2201/09563* (2013.01); *H05K 2201/09781* (2013.01); *H05K 2201/10128* (2013.01); *H05K 2203/0278* (2013.01)

(56) References Cited

U.S. PATENT DOCUMENTS

| | | | |
|---|---|---|---|
| 7,109,575 B2* | 9/2006 | Kang | G02F 1/13452 257/685 |
| 2007/0285903 A1* | 12/2007 | Tomari | G02F 1/13452 361/748 |
| 2012/0262886 A1 | 10/2012 | Yamagishi | |

FOREIGN PATENT DOCUMENTS

| | | |
|---|---|---|
| JP | 2002-63958 A | 2/2002 |
| JP | 2008-117972 A | 5/2008 |
| JP | 2010-147084 A | 7/2010 |
| JP | 2010147084 A * | 7/2010 |
| JP | 2011-244006 A | 12/2011 |
| JP | 2012-226058 A | 11/2012 |

OTHER PUBLICATIONS

Notification of Reasons for Refusal dated Mar. 11, 2014 issued in counterpart Japanese application No. 2013-200337, with English translation (12 pages).

Notification of Reasons for Refusal dated Jul. 29, 2014 issued in counterpart Japanese application No. 2013-200337, with English translation (7 pages).

* cited by examiner

A-A' CROSS SECTION

B-B' CROSS SECTION

FLEXIBLE PRINTED BOARD

TECHNICAL FIELD

The present invention relates to a flexible printed board connected to another electronic component by thermal compression bonding.

BACKGROUND ART

A display apparatus (see, for example, Patent Literature 1 shown below) including, for example, a structure in which a flexible printed board or COF and a liquid crystal panel are connected has been known. In such a display apparatus, the liquid crystal panel and a drain substrate are electrically connected by a compression bonding terminal portion inside an outline frame of the drain substrate along one side of the drain substrate being compression-bonding-connected to a flexible printed board or the like extending from the side of the liquid crystal panel via an anisotropic conductive material such as ACF.

In general, a structure as shown, for example, in FIGS. 8 and 9 is used to connect a liquid crystal panel and a flexible printed board on the liquid crystal panel side. FIG. 8 is a diagram showing a connection structure of a conventional flexible printed board and FIG. 9 is a B-B' sectional view of FIG. 8. As shown in FIGS. 8 and 9, a conventional flexible printed board 110 includes front wires 114 formed on one surface of a flexible substrate 111 and rear wires 115 formed on the other surface and a cover lay 113 is provided on these wires 114, 115 via an adhesive agent 112.

A compression bonding connection portion to a panel terminal 102 provided inside a panel outline frame of a liquid crystal panel 101 is formed by removing the adhesive agent 112 and the cover lay 113 on the side of the front wires 114 to expose a connection terminal 116. The connection terminal 116 and the panel terminal 102 are electrically connected via an anisotropic conductive material 119 and the rear wire 115 and the connection terminal 116 are connected by a through wire 117 provided outside the panel outline frame outside an area to be compression-bonding-connected in a state of penetrating the connection terminal 116, the flexible substrate 111, and the rear wire 115.

PRIOR ART DOCUMENT

Patent Literature

Patent Literature 1: JP 2012-226058 A

SUMMARY OF THE INVENTION

Problem to be Solved by the Invention

However, a flexible printed board in a conventional display apparatus disclosed in Patent Literature 1 and a flexible printed board used in the aforementioned connection structure have a flexible substrate, an adhesive agent, a cover lay and the like made of materials far softer than a connection terminal arranged on the opposite side of an anisotropic conductive material side of the connection terminal and thus, a poor connection may be established without a necessary predetermined pressure applied to a compression bonding connection portion during compression bonding connection, resulting in a problem of low connection reliability.

An object of the present invention is to provide a flexible printed board capable of improving connection reliability by solving the aforementioned problem of the conventional technology.

Means for Solving the Problem

A flexible printed board according to the present invention is electrically connected to an electronic component by thermal compression bonding, and the flexible printed board includes: a flexible substrate; a terminal portion formed on one surface of the flexible substrate and having a plurality of connection terminals to be connected to the electronic component; a wire portion having a plurality of wires formed on the other surface of the flexible substrate; and a plurality of through wires formed inside through holes penetrating the flexible substrate in a compression bonding connection area of the terminal portion to the electronic component to connect the connection terminals of the terminal portion to the respective wires of the wire portion.

According to the flexible printed board in the present invention, the terminal portion and the wire portion are connected by through wires that connect each connection terminal and each wire in the area of the terminal portion and therefore, the wire portion that is relatively hard is arranged on the opposite side of the terminal portion and a predetermined pressure needed for compression bonding connection can be applied to a compression bonding connection portion so that connection reliability can be improved.

In an embodiment of the present invention, the wire portion is formed such that the plurality of wires is arranged overall in an area corresponding to the terminal portion.

In another embodiment of the present invention, the wire portion extends in a direction in which the wires intersect the connection terminals and is formed such that the number of wires arranged between the connection terminals arranged adjacently is approximately equal in plane view in the area corresponding to the terminal portion. Accordingly, the wire portion can be arranged inside an outline frame of an electronic component and the arrangement space can be saved by making the overall size smaller. In addition, the wire portion that is relatively hard is uniformly arranged on the opposite side of the terminal portion and therefore, a predetermined pressure needed for thermal compression bonding can uniformly be applied to the terminal portion and connection reliability can be improved by inhibiting the occurrence of poor connection.

In another embodiment of the present invention, the wire portion is formed so as to extend from the area corresponding to the terminal portion to both sides along an adjacent direction of arrangement of the connection terminals of the terminal portion.

In another embodiment of the present invention, the wire portion has the wires extending in a direction parallel to the connection terminals.

In another embodiment of the present invention, the terminal portion is connected to the electronic component via an anisotropic conductive material.

In another embodiment of the present invention, the wire portion has dummy wires in a portion of the plurality of wires.

Advantageous Effects of Invention

According to the present invention, connection reliability can be improved.

EMBODIMENTS FOR CARRYING OUT THE INVENTION

Hereinafter, flexible printed boards according to the embodiments of the present invention will be described in detail with reference to the appended drawings.

First Embodiment

Figure 1:
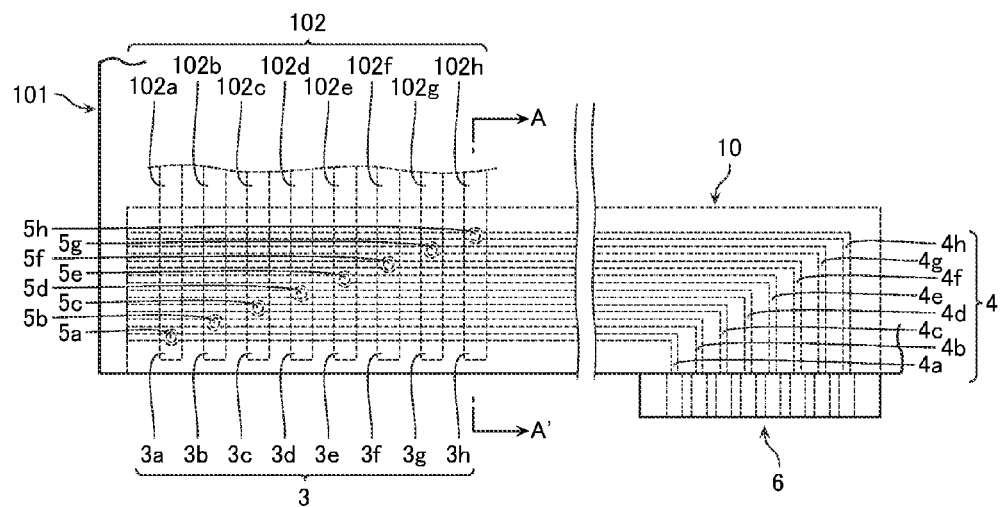
FIG. 1 is a plan view showing a flexible printed board according to a first embodiment of the present invention.
Figure 2:
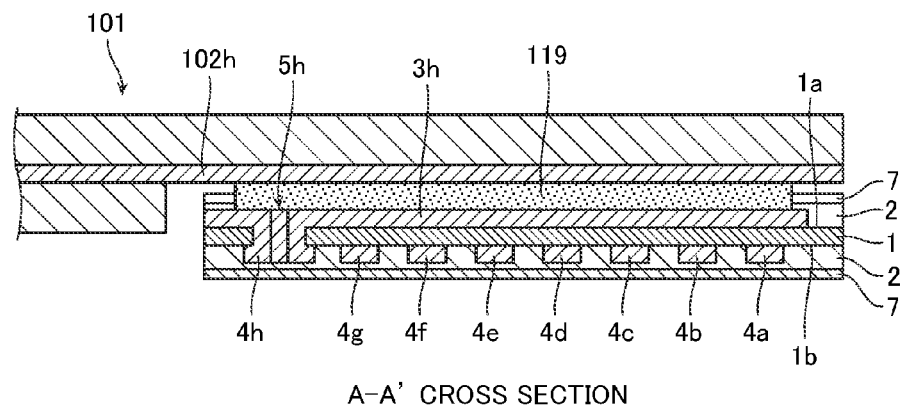
FIG. 2 is an A-A' sectional view of FIG. 1.

FIG. 1 is a plan view showing a flexible printed board according to the first embodiment of the present invention. FIG. 2 is an A-A' sectional view of FIG. 1. As shown in FIGS. 1 and 2, a flexible printed board (hereinafter, referred to as "FPC") 10 according to the first embodiment is electrically connected to a liquid crystal panel (hereinafter, referred to as "LCD") 101 as another electronic component by, for example, thermal compression bonding.

The FPC 10 includes a flexible substrate 1 made of an insulating resin, for example, polyimide or polyamide and a terminal portion 3 formed on one surface (front surface) 1a of the flexible substrate 1 and having a plurality of connection terminals 3a, 3b, 3c, 3d, 3e, 3f, 3g, 3h to be connected to the LCD 101.

The FPC 10 also includes a wire portion 4 formed on the other surface (rear surface) 1b of the flexible substrate 1 and having a plurality of wires 4a, 4b, 4c, 4d, 4e, 4f, 4g, 4h and filled through holes (hereinafter, referred to as "F-TH") 5a, 5b, 5c, 5d, 5e, 5f, 5g, 5h as a plurality of through wires that connect the connection terminals 3a to 3h of the terminal portion 3 and the wires 4a to 4h of the wire portion 4 respectively by penetrating the flexible substrate 1 in the area of the terminal portion 3.

A connector portion 6 to be connected to a connector terminal provided on a circuit board (not shown) of the LCD 101 as another board or component is formed on an edge on the opposite side of the side of the terminal portion 3 of the wire portion 4. Thus, the FPC 10 assumes the role of electrically connecting the LCD 101 and the circuit board.

Further, the FPC 10 includes a cover lay 7 made of the insulating resin as described above coated via an adhesive agent 2 on the front and rear surfaces 1a, 1b of the flexible substrate 1. The adhesive agent 2 and the cover lay 7 are not formed in the area of the terminal portion 3 on the side of the front surface 1a of the flexible substrate 1 and the connection terminals 3a to 3h are exposed.

The terminal portion 3 and the wire portion 4 of the FPC 10 are made of a conductor of nickel, chromium, copper or the like formed on the front surface 1a and the rear surface 1b of the flexible substrate 1 by, for example, sputtering or vapor deposition. The F-THs 5a to 5h are formed by forming through holes of about 25 μm in diameter so as to penetrate the wires 4a to 4h by passing through the flexible substrate 1 from the connection terminals 3a to 3h of the terminal portion 3 respectively by, for example, YAG laser and then filling in the through hole by performing plating by the semi-additive method.

The connection terminals 3a to 3h and the wires 4a to 4h of the terminal portion 3 and the wire portion 4 have a thickness of about 12 μm and the connection terminals 3a to 3h are formed in a thinly rectangular shape and arranged side by side along the width direction thereof (longitudinal direction of the FPC 10). The connection terminals 3a to 3h are formed such that the width thereof and the interval therebetween are about 80 μm.

The connection terminals 3a to 3h are formed in positions overlapping with LCD terminals 102a, 102b, 102c, 102d, 102e, 102f, 102g, 102h of the LCD terminal portion 102 respectively provided in an inner area of the LCD 101 (inside the outline frame of the LCD 101) during thermal compression bonding.

Then, in the first embodiment, the connection terminals 3a to 3h are electrically connected to the LCD terminals 102a to 102h respectively via an anisotropic conductive material 119 made of an anisotropic conductive paste (ACP) or an anisotropic conductive film (ACF) by thermal compression bonding. Incidentally, the connection terminals 3a to 3h and the LCD terminals 102a to 102h may be connected by thermal compression bonding without the medium of the anisotropic conductive material 119.

The wires 4a to 4h are formed by linearly extending mainly along the longitudinal direction of the FPC 10 (width direction of the connection terminals 3a to 3h) and being arranged side by side in the longitudinal direction of the connection terminals 3a to 3h. The wires 4a to 4h are each formed so as to be bent near the connector portion 6 by 90° to extend toward the connector portion 6 in parallel.

Therefore, the wires 4a to 4h of the wire portion 4 are formed in a state of being orthogonal to the connection terminals 3a to 3h in plane view in an area corresponding to the terminal portion 3 and formed such that the number of the wires 4a to 4h arranged between each of the connection terminals 3a to 3h arranged adjacently as described above is approximately equal.

That is, the wire portion 4 is structured such that in the corresponding area, an equal number of eight wires of the wires 4a to 4h are each arranged between the connection terminals 3a, 3b, between the connection terminals 3b, 3c, between the connection terminals 3c, 3d, between the connection terminals 3d, 3e, between the connection terminals 3e, 3f, between the connection terminals 3f, 3g, and between the connection terminals 3g, 3h.

In the area of the terminal portion 3, the F-THs 5a to 5h are each formed in different positions along the side-by-side arrangement direction of the connection terminals 3a to 3h and the side-by-side arrangement direction of the wires 4a to 4h. More specifically, if, as shown in FIG. 1, the F-TH 5a is formed on a base end side of the connection terminal 3a (tip side of the LCD terminal 102a) and the F-TH 5h is formed on a tip side of the connection terminal 3h (base end side of the LCD terminal 102h), the other F-THs 5b to 5g are formed in positions on a straight line connecting the F-THs 5a, 5h in a plane or neighboring positions of the straight line. That is, the F-THs 5a to 5h are formed such that a state of connecting these positions by a line is like an oblique line.

In the FPC 10 according to the first embodiment, the terminal portion 3, the wire portion 4, and the F-THs 5a to 5h are formed as described above and thus, almost all portions of the FPC 10 excluding the connector portion 6 can be arranged to be accommodated inside the outline frame of the LCD 101. Therefore, compared with conventional FPC, the arrangement space can be saved by making the overall size smaller.

In addition, the LCD terminal portion 102 and the terminal portion 3 can be thermal compression bonded by applying a predetermined pressure to the whole connection area uniformly and therefore, conductive particles of the anisotropic conductive material 119 between the LCD terminals 102a to 102h and the connection terminals 3a to 3h can reliably be brought into contact therewith and connection reliability can be improved by inhibiting poor connection.

Second Embodiment

Figure 3:
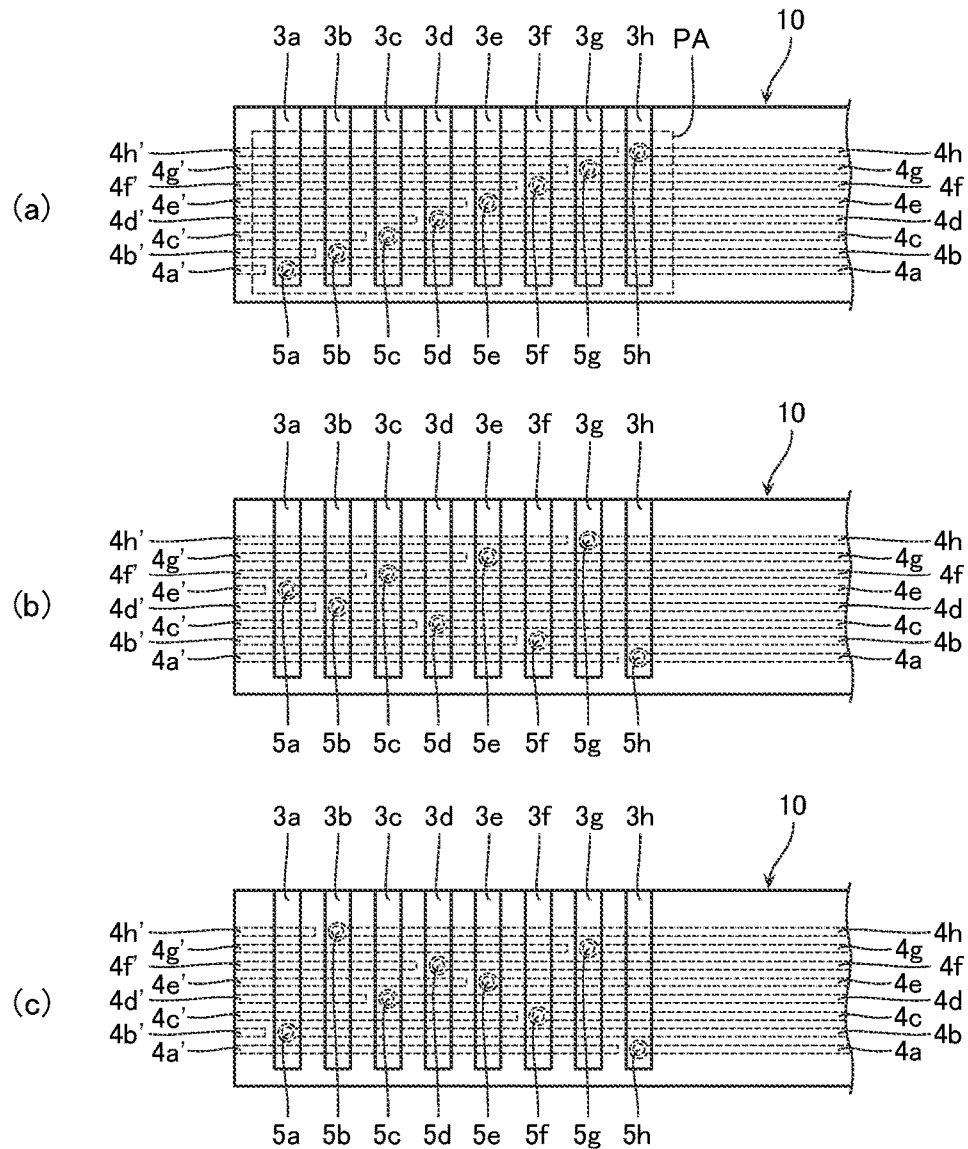
FIGS. 3(a) to 3(c) are plan views showing the flexible printed board according to a second embodiment of the present invention.

FIG. 3 is a plan view showing the flexible printed board according to the second embodiment of the present invention and FIGS. 3(a), 3(b), and 3(c) show mutually different formation positions of the F-THs 5a to 5h. FIG. 3(a) shows the formation positions of the F-THs 5a to 5h similar to those in the first embodiment, FIG. 3(b) shows the formation positions of the F-THs 5a to 5h in a dogleg shape in plane view when these positions are connected by a line, and FIG. 3(c) shows the formation positions of the F-THs 5a to 5h are random. Hereinafter, the same reference signs are attached to portions already described and the description thereof may be omitted.

The FPC 10 according to the second embodiment is mainly different from the FPC 10 in the first embodiment in that the wire portion 4 has dummy wires 4a' to 4h' in a portion of the wires 4a to 4h. The dummy wires 4a' to 4h' are formed like similarly extending coaxially with the wires 4a to 4h in the area corresponding to the terminal portion 3, but are not connected to the connection terminals 3a to 3h and the wires 4a to 4h and are wires not electrically utilized in an unconnected state from the viewpoint of circuit.

When compared with the FPC 10 in the first embodiment, the FPC 10 according to the second embodiment has, instead of an approximately equal number of all the wires 4a to 4h, an approximately equal number of wires including the dummy wires 4a' to 4h' arranged between each of the connection terminals 3a to 3h in, for example, a compression bonding connection area PA shown in FIG. 3(a) and thus, a predetermined pressure can be applied uniformly during thermal compression bonding while noise resistance is improved with good high-frequency characteristics so that the aforementioned operation/effect can be achieved.

For reasons of signal noise countermeasures, the dummy wires 4a' to 4h' are formed such that a gap in the horizontal direction between the end face on the side of the wires 4a to 4h of the dummy wires 4a' to 4h' and the side end face on the side of the dummy wires 4a' to 4h' of the connection terminals 3a to 3h to which the wires 4a to 4h are connected via the F-THs 5a to 5h is 5 μm or more. Also, the dummy wires 4a' to 4h' are formed such that the gap is not arranged below the connection terminals 3a to 3h via the flexible substrate 1.

As shown in FIGS. 3(a) to 3(c), the wires 4a to 4h of the wire portion 4 are formed so as to extend from an area corresponding to the terminal portion 3 to one side (side on the opposite side of the side of the connection terminal 3g of the connection terminal 3h) along an adjacent direction of arrangement of the connection terminals 3a to 3h of the terminal portion 3. The wires 4a to 4h, the dummy wires 4a' to 4h', the F-THs 5a to 5h, and the connection terminals 3a to 3h are formed, for example, as described below.

First, the example shown in FIG. 3(a) will be described. As shown in FIG. 3(a), the wire 4a is connected to the connection terminal 3a from below the connection terminal 3a via the F-TH 5a bypassing below the connection terminals 3h, 3g, 3f, 3e, 3d, 3c, 3b. The dummy wire 4a' is formed so as to extend from the side end face of the connection terminal 3a to the end of the FPC 10 across a gap along the wire 4a without passing below any connection terminal.

The wires 4b, 4c, . . . , 4h are similarly connected to the connection terminals 3b, 3c, . . . , 3h from below the connection terminals 3b, 3c, . . . , 3h via the F-THs 5b, 5c, . . . , 5h bypassing below the connection terminals 3h to 3c, 3h to 3d, . . . , 3h respectively. The dummy wires 4b', 4c', . . . , 4h' are formed so as to extend from the side end face of the connection terminals 3b, 3c, . . . , 3h to the end of the FPC 10 across a gap along the wires 4b, 4c, . . . , 4h by passing below the connection terminals 3a, 3b, . . . , 3g respectively.

Next, the example shown in FIG. 3(b) will be described. As shown in FIG. 3(b), the wire 4a is connected to the connection terminal 3h from below the connection terminal 3h via the F-TH 5h. The dummy wire 4a' is formed so as to extend from the side end face of the connection terminal 3h to the end of the FPC 10 across a gap along the wire 4a by passing below the connection terminals 3g to 3a.

The wires 4b, 4c, . . . , 4h are connected to the connection terminals 3f, 3d, 3b, 3a, 3c, 3e, 3g from below the connection terminals 3f, 3d, 3b, 3a, 3c, 3e, 3g via the F-THs 5f, 5d, 5b, 5a, 5c, 5e, 5g by passing below the connection terminals 3h to 3g, 3h to 3e, 3h to 3c, 3h to 3b, 3h to 3d, 3h to 3f, 3h respectively. The dummy wires 4b', 4c', . . . , 4h' are formed, excluding the dummy wire 4e', so as to extend from the side end face of the connection terminals 3f, 3d, 3b, 3c, 3e, 3g to the end of the FPC 10 across a gap along the wires 4b, 4c, . . . , 4h by passing below the connection terminals 3e to 3a, 3c to 3a, 3a, 3b to 3a, 3d to 3a, 3f to 3a respectively. The dummy wire 4e' is formed so as to extend from the side end face of the connection terminal 3a to the end of the FPC 10 across a gap along the wire 4e without passing below any connection terminal. Therefore, the F-THs 5a to 5h are formed in a dogleg shape in plane view when these positions are connected by a line.

Next, the example shown in FIG. 3(c) will be described. As shown in FIG. 3(c), the wire 4a is connected to the connection terminal 3h from below the connection terminal 3h via the F-TH 5h. The dummy wire 4a' is formed so as to extend from the side end face of the connection terminal 3h to the end of the FPC 10 across a gap along the wire 4a by passing below the connection terminals 3g to 3a.

The wires 4b, 4c, . . . , 4h are connected to the connection terminals 3a, 3f, 3c, 3e, 3d, 3g, 3b from below the connection terminals 3a, 3f, 3c, 3e, 3d, 3g, 3b via the F-THs 5a, 5f, 5c, 5e, 5d, 5g, 5b by passing below the connection terminals 3h to 3b, 3h to 3g, 3h to 3d, 3h to 3f, 3h to 3e, 3h, 3h to 3c respectively. The dummy wires 4b', 4c', . . . , 4h' are formed, excluding the dummy wire 4b', so as to extend from the side end face of the connection terminals 3f, 3c, 3e, 3d, 3g, 3b to the end of the FPC 10 across a gap along the wires 4c, 4d, . . . , 4h by passing below the connection terminals 3e to 3a, 3b to 3a, 3d to 3a, 3c to 3a, 3f to 3a, 3a respectively. The dummy wire 4b' is formed so as to extend from the side end face of the connection terminal 3a to the end of the FPC 10 across a gap along the wire 4b without passing below any connection terminal. Therefore, the F-THs 5a to 5h are formed in random positions.

Third Embodiment

Figure 4:
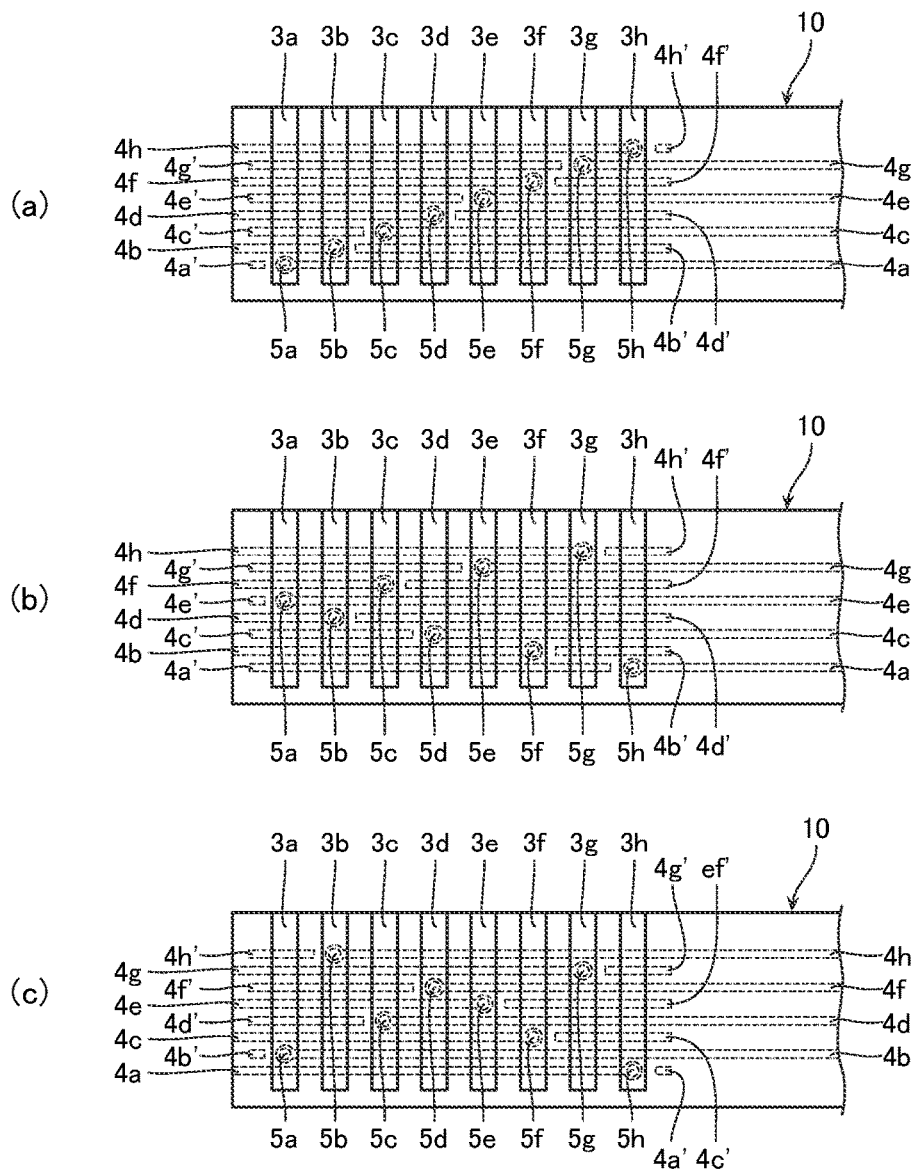
FIGS. 4(a) to 4(c) are plan views showing the flexible printed board according to a third embodiment of the present invention.

FIG. 4 is a plan view showing the flexible printed board according to the third embodiment of the present invention, FIGS. 4(a), 4(b), and 4(c) show mutually different formation positions of the F-THs 5a to 5h, and formation positions of the F-THs 5a to 5h in FIGS. 4(a) to 4(c) correspond to those in FIGS. 3(a) to 3(c).

The FPC 10 according to the third embodiment is similar to the FPC 10 in the second embodiment in that the wires 4a to 4h and the dummy wires 4a' to 4h' are included, but is different in that, as shown in FIGS. 4(a) to 4(c), the wires 4a to 4h of the wire portion 4 are formed so as to extend from the area corresponding to the terminal portion 3 to both sides along the adjacent direction of arrangement of the connection terminals 3a to 3h of the terminal portion 3.

First, the example shown in FIG. 4(a) will be described. As shown in FIG. 4(a), the wire 4a extends to the side of the opposite side of the side of the connection terminal 3g of the connection terminal 3h and also is connected to the connection terminal 3a from below the connection terminal 3a via the F-TH 5a by passing below the connection terminals 3h to 3b. The dummy wire 4a' is formed so as to extend from the side end face of the connection terminal 3a to immediately before the end of the FPC 10 across a gap along the wire 4a without passing below any connection terminal.

The wires 4c, 4e, 4g are similarly connected to the connection terminals 3c, 3e, 3g from below the connection terminals 3c, 3e, 3g via the F-THs 5c, 5e, 5g bypassing below the connection terminals 3h to 3d, 3h to 3f, 3h respectively. The dummy wires 4c', 4e', 4g' are formed so as to extend from the side end face of the connection terminals 3c, 3e, 3g to immediately before the end of the FPC 10 across a gap along the wires 4c, 4e, 4g without passing below the connection terminals 3b to 3a, 3d to 3a, 3f to 3a respectively.

On the other hand, the wire 4b extends to the side of the opposite side of the side of the connection terminal 3b of the connection terminal 3a and also is connected to the connection terminal 3b from below the connection terminal 3b via the F-TH 5b by passing below the connection terminal 3a. The dummy wire 4b' is formed so as to extend from the side end face of the connection terminal 3b to past the connection terminal 3h across a gap along the wire 4b by passing below the connection terminals 3c to 3h.

The wires 4d, 4f, 4h are similarly connected to the connection terminals 3d, 3f, 3h from below the connection terminals 3d, 3f, 3h via the F-THs 5d, 5f, 5h bypassing below the connection terminals 3a to 3c, 3a to 3e, 3a to 3g respectively. The dummy wires 4d', 4f', 4h' are formed, excluding the dummy wire 4h', so as to extend from the side end face of the connection terminals 3d, 3f to past the connection terminal 3h across a gap along the wires 4d, 4f by passing below the connection terminals 3e to 3h, 3g to 3h respectively. The dummy wire 4h' is formed so as to extend from the side end face of the connection terminal 3h to as far as the end faces of the dummy wires 4b', 4d', 4f' across a gap along the wire 4h without passing below any connection terminal.

Next, the example shown in FIG. 4(b) will be described. In FIG. 4(b), the direction in which the wires 4a, 4c, 4e, 4g extend and the direction in which the wires 4b, 4d, 4f, 4h extend are similar to those shown in FIG. 4(a). As shown in FIG. 4(b), the wire 4a is connected to the connection terminal 3h from below the connection terminal 3h via the F-TH 5h. The dummy wire 4a' is formed so as to extend from the side end face of the connection terminal 3h to immediately before the end of the FPC 10 across a gap along the wire 4a by passing below the connection terminals 3g to 3a.

The wires 4c, 4e, 4g are similarly connected to the connection terminals 3d, 3a, 3e from below the connection terminals 3d, 3a, 3e via the F-THs 5d, 5a, 5e bypassing below the connection terminals 3h to 3e, 3h to 3b, 3h to 3f respectively. The dummy wires 4c', 4e', 4g' are formed, excluding the dummy wire 4e', so as to extend from the side end face of the connection terminals 3d, 3e to immediately before the end of the FPC 10 across a gap along the wires 4c, 4g by passing below the connection terminals 3c to 3a, 3d to 3a respectively. The dummy wire 4e' is formed so as to extend from the side end face of the connection terminal 3a to immediately before the end of the FPC 10 across a gap along the wire 4e without passing below any connection terminal.

On the other hand, the wire 4b is connected to the connection terminal 3f from below the connection terminal 3f via the F-TH 5f by passing below the connection terminals 3a to 3e. The dummy wire 4b' is formed so as to extend from the side end face of the connection terminal 3f to past the connection terminal 3h across a gap along the wire 4b by passing below the connection terminals 3g to 3h.

The wires 4d, 4f, 4h are similarly connected to the connection terminals 3b, 3c, 3g from below the connection terminals 3b, 3c, 3g via the F-THs 5b, 5c, 5g bypassing below the connection terminals 3a, 3a to 3b, 3a to 3f respectively. The dummy wires 4d', 4f', 4h' are formed so as to extend from the side end face of the connection terminals 3b, 3c, 3g to past the connection terminal 3h across a gap along the wires 4d, 4f, 4h by passing below the connection terminals 3c to 3h, 3d to 3h, 3h respectively.

Next, the example shown in FIG. 4(c) will be described. As shown in FIG. 4(c), the wire 4a extends to the side of the opposite side of the side of the connection terminal 3b of the connection terminal 3a and also is connected to the connection terminal 3h from below the connection terminal 3h via the F-TH 5h by passing below the connection terminals 3a to 3g. The dummy wire 4a' is formed so as to extend from the side end face of the connection terminal 3h to past the connection terminal 3h by passing through a gap along the wire 4a without passing below any connection terminal.

The wires 4c, 4e, 4g are similarly connected to the connection terminals 3f, 3e, 3g from below the connection terminals 3f, 3e, 3g via the F-THs 5f, 5e, 5g bypassing below the connection terminals 3a to 3e, 3a to 3d, 3a to 3f respectively. The dummy wires 4c', 4e', 4g' are formed so as to extend from the side end face of the connection terminals 3f, 3e, 3g to past the connection terminal 3h across a gap along the wires 4c, 4e, 4g without passing below the connection terminals 3g to 3h, 3f to 3h, 3h respectively.

On the other hand, the wire 4b extends to the side of the opposite side of the side of the connection terminal 3g of the connection terminal 3h and also is connected to the connection terminal 3a from below the connection terminal 3a via the F-TH 5a by passing below the connection terminals 3h to 3b. The dummy wire 4b' is formed so as to extend from the side end face of the connection terminal 3a to immediately before the end of the FPC 10 across a gap along the wire 4b without passing below any connection terminal.

The wires 4d, 4f, 4h are similarly connected to the connection terminals 3c, 3d, 3b from below the connection terminals 3c, 3d, 3b via the F-THs 5c, 5d, 5b bypassing below the connection terminals 3h to 3d, 3h to 3e, 3h to 3c respectively. The dummy wires 4d', 4f', 4h' are formed so as to extend from the side end face of the connection terminals 3c, 3d, 3b to immediately before the end of the FPC 10 across a gap along the wires 4d, 4f, 4h bypassing below the connection terminals 3b to 3a, 3c to 3a, 3a respectively.

Fourth Embodiment

Figure 5:
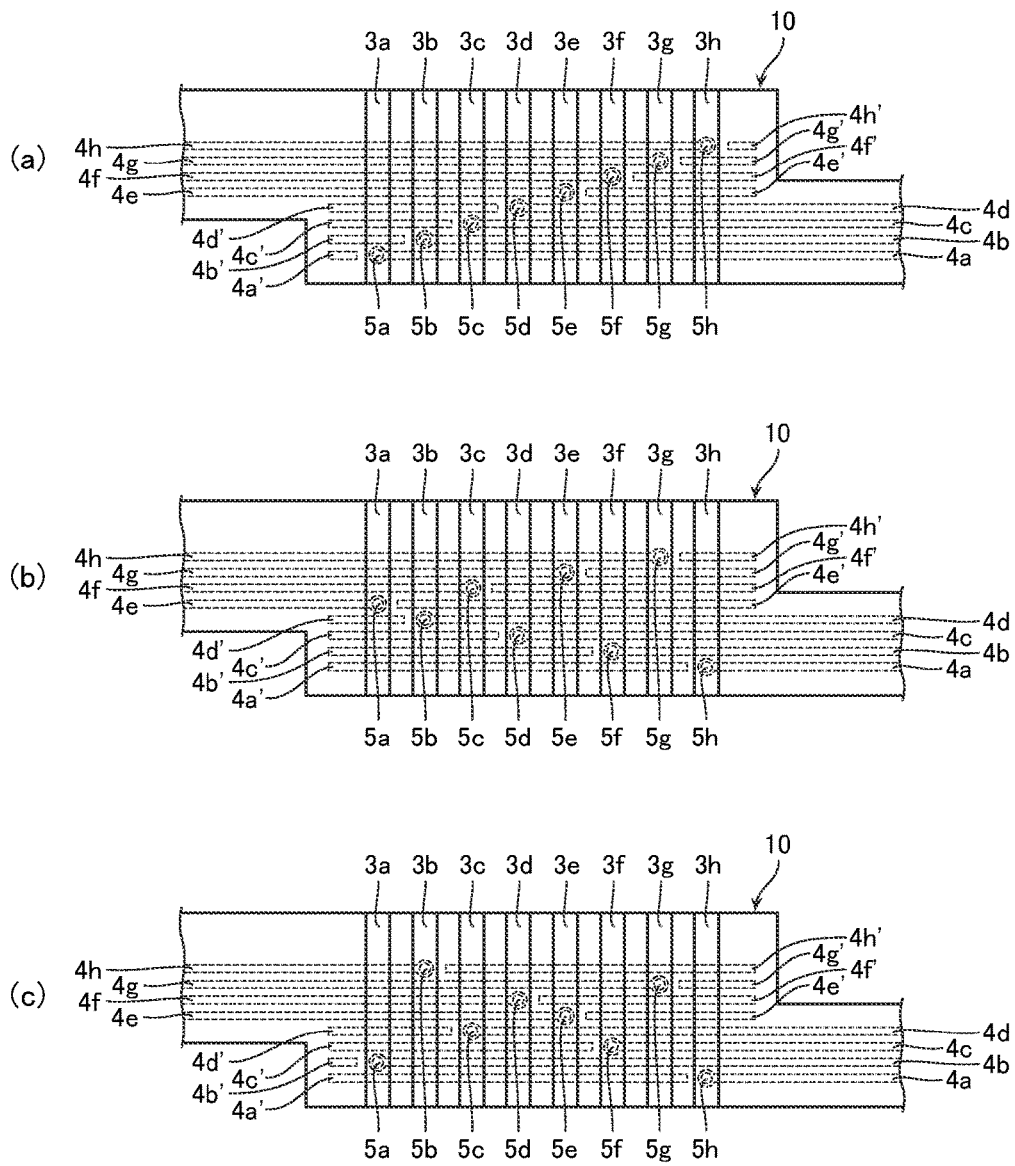
FIGS. 5(a) to 5(c) are plan views showing the flexible printed board according to a fourth embodiment of the present invention.

FIG. 5 is a plan view showing the flexible printed board according to the fourth embodiment of the present invention, FIGS. 5(a), 5(b), and 5(c) show mutually different formation positions of the F-THs 5a to 5h, and formation positions of the F-THs 5a to 5h in FIGS. 5(a) to 5(c) correspond to those in FIGS. 3(a) to 3(c) and FIGS. 4(a) to 4(c).

The FPC 10 according to the fourth embodiment is similar to the FPC 10 in the third embodiment in that the wires 4a to 4h and the dummy wires 4a' to 4h' are included and the wires 4a to 4h of the wire portion 4 are formed so as to extend from the area corresponding to the terminal portion 3 to both sides along the adjacent direction of arrangement of the connection terminals 3a to 3h of the terminal portion 3, but combinations of wires extending in opposite directions are different.

More specifically, in each of FIGS. 5(a) to 5(c), the wires 4a to 4d are formed so as to extend to the opposite side of the side of the connection terminal 3g of the connection terminal 3h and the wires 4e to 4h are formed so as to extend to the opposite side of the side of the connection terminal 3b of the connection terminal 3a. Correspondingly, the shape of the FPC 10 is not a simple rectangular shape, but is formed in a crank shape as a whole having a width narrower than the width of the terminal portion 3 to fit to a portion of the wires 4a to 4h extending from the rectangular area where the terminal portion 3 is formed.

First, the example shown in FIG. 5(a) will be described. As shown in FIG. 5(a), the wire 4a is connected to the connection terminal 3a from below the connection terminal 3a via the F-TH 5a by passing below the connection terminals 3h to 3b. The dummy wire 4a' is formed so as to extend from the side end face of the connection terminal 3a to immediately before the end of the FPC 10 across a gap along the wire 4a without passing below any connection terminal.

The wires 4b, 4c, 4d are similarly connected to the connection terminals 3b, 3c, 3d from below the connection terminals 3b, 3c, 3d via the F-THs 5b, 5c, 5d bypassing below the connection terminals 3h to 3c, 3h to 3d, 3h to 3e respectively. The dummy wires 4b', 4c', 4d' are formed so as to extend from the side end face of the connection terminals 3b, 3c, 3d to as far as the end face of the dummy wire 4a' across a gap along the wires 4b, 4c, 4d by passing below the connection terminals 3a, 3b to 3a, 3c to 3a respectively.

On the other hand, the wire 4e is connected to the connection terminal 3e from below the connection terminal 3e via the F-TH 5e by passing below the connection terminals 3a to 3d. The dummy wire 4e' is formed so as to extend from the side end face of the connection terminal 3e to as far as the end face of the dummy wires 4f', 4g', 4h' across a gap along the wire 4e by passing below the connection terminals 3f to 3h.

The wires 4f, 4g, 4h are similarly connected to the connection terminals 3f, 3g, 3h from below the connection terminals 3f, 3g, 3h via the F-THs 5f, 5g, 5h bypassing below the connection terminals 3a to 3e, 3a to 3f, 3a to 3g respectively. The dummy wires 4f', 4g', 4h' are formed, excluding the dummy wire 4h', so as to extend from the side end face of the connection terminals 3f, 3g to as far as the end face of the dummy wire 4h' across a gap along the wires 4f, 4g by passing below the connection terminals 3g to 3h, 3h respectively. The dummy wire 4h' is formed so as to extend from the side end face of the connection terminal 3h to immediately before the end of the FPC 10 across a gap along the wire 4h without passing below any connection terminal.

Next, the example shown in FIG. 5(b) will be described. As shown in FIG. 5(b), the wire 4a is connected to the connection terminal 3h from below the connection terminal 3h via the F-TH 5h. The dummy wire 4a' is formed so as to extend from the side end face of the connection terminal 3h to immediately before the end of the FPC 10 across a gap along the wire 4a by passing below the connection terminals 3g to 3a.

The wires 4b, 4c, 4d are similarly connected to the connection terminals 3f, 3d, 3b from below the connection terminals 3f, 3d, 3b via the F-THs 5f, 5d, 5b bypassing below the connection terminals 3h to 3g, 3h to 3e, 3h to 3c respectively. The dummy wires 4b', 4c', 4d' are formed so as to extend from the side end face of the connection terminals 3f, 3d, 3b to as far as the end face of the dummy wire 4a' across a gap along the wires 4b, 4c, 4d by passing below the connection terminals 3e to 3a, 3c to 3a, 3a respectively.

On the other hand, the wire 4e is connected to the connection terminal 3a from below the connection terminal 3a via the F-TH 5a. The dummy wire 4e' is formed so as to extend from the side end face of the connection terminal 3a to as far as the end face of the dummy wires 4f', 4g', 4h' across a gap along the wire 4e by passing below the connection terminals 3b to 3h.

The wires 4f, 4g, 4h are similarly connected to the connection terminals 3c, 3e, 3g from below the connection terminals 3c, 3e, 3g via the F-THs 5c, 5e, 5g bypassing below the connection terminals 3a to 3b, 3a to 3d, 3a to 3f respectively. The dummy wires 4f', 4g', 4h' are formed so as to extend from the side end face of the connection terminals 3c, 3e, 3g to as far as the end face of the dummy wire 4e' across a gap along the wires 4f, 4g, 4h by passing below the connection terminals 3d to 3h, 3f to 3h, 3h respectively. The dummy wire 4h' is formed so as to extend immediately before the end of the FPC 10.

Next, the example shown in FIG. 5(c) will be described. As shown in FIG. 5(c), the wire 4a is connected to the connection terminal 3h from below the connection terminal 3h via the F-TH 5h. The dummy wire 4a' is formed so as to extend from the side end face of the connection terminal 3h to immediately before the end of the FPC 10 across a gap along the wire 4a by passing below the connection terminals 3g to 3a.

The wires 4b, 4c, 4d are similarly connected to the connection terminals 3a, 3f, 3c from below the connection terminals 3a, 3f, 3c via the F-THs 5a, 5f, 5c bypassing below the connection terminals 3h to 3b, 3h to 3g, 3h to 3d respectively. The dummy wires 4b', 4c', 4d' are formed, excluding the dummy wire 4b', so as to extend from the side end face of the connection terminals 3f, 3c to as far as the end face of the dummy wire 4a' across a gap along the wires 4c, 4d by passing below the connection terminals 3e to 3a, 3b to 3a respectively. The dummy wire 4b' is formed so as to extend from the side end face of the connection terminal 3a to as far as the end face of the dummy wire 4a' across a gap along the wire 4b without passing below any connection terminal.

On the other hand, the wire 4e is connected to the connection terminal 3e from below the connection terminal 3e via the F-TH 5e by passing below the connection terminals 3a to 3d. The dummy wire 4e' is formed so as to extend from the side end face of the connection terminal 3e to as far as the end face of the dummy wires 4f', 4g', 4h' across a gap along the wire 4e by passing below the connection terminals 3f to 3h.

The wires 4f, 4g, 4h are similarly connected to the connection terminals 3d, 3g, 3b from below the connection terminals 3d, 3g, 3b via the F-THs 5d, 5g, 5b bypassing below the connection terminals 3a to 3c, 3a to 3f, 3a respectively. The dummy wires 4f', 4g', 4h' are formed so as to extend from the side end face of the connection terminals 3d, 3g, 3b to as far as the end face of the dummy wire 4e' across a gap along the wires 4f, 4g, 4h by passing below the connection terminals 3e to 3h, 3h, 3c to 3h respectively. The dummy wire 4h' is formed so as to extend immediately before the end of the FPC 10.

Fifth Embodiment

Figure 6:
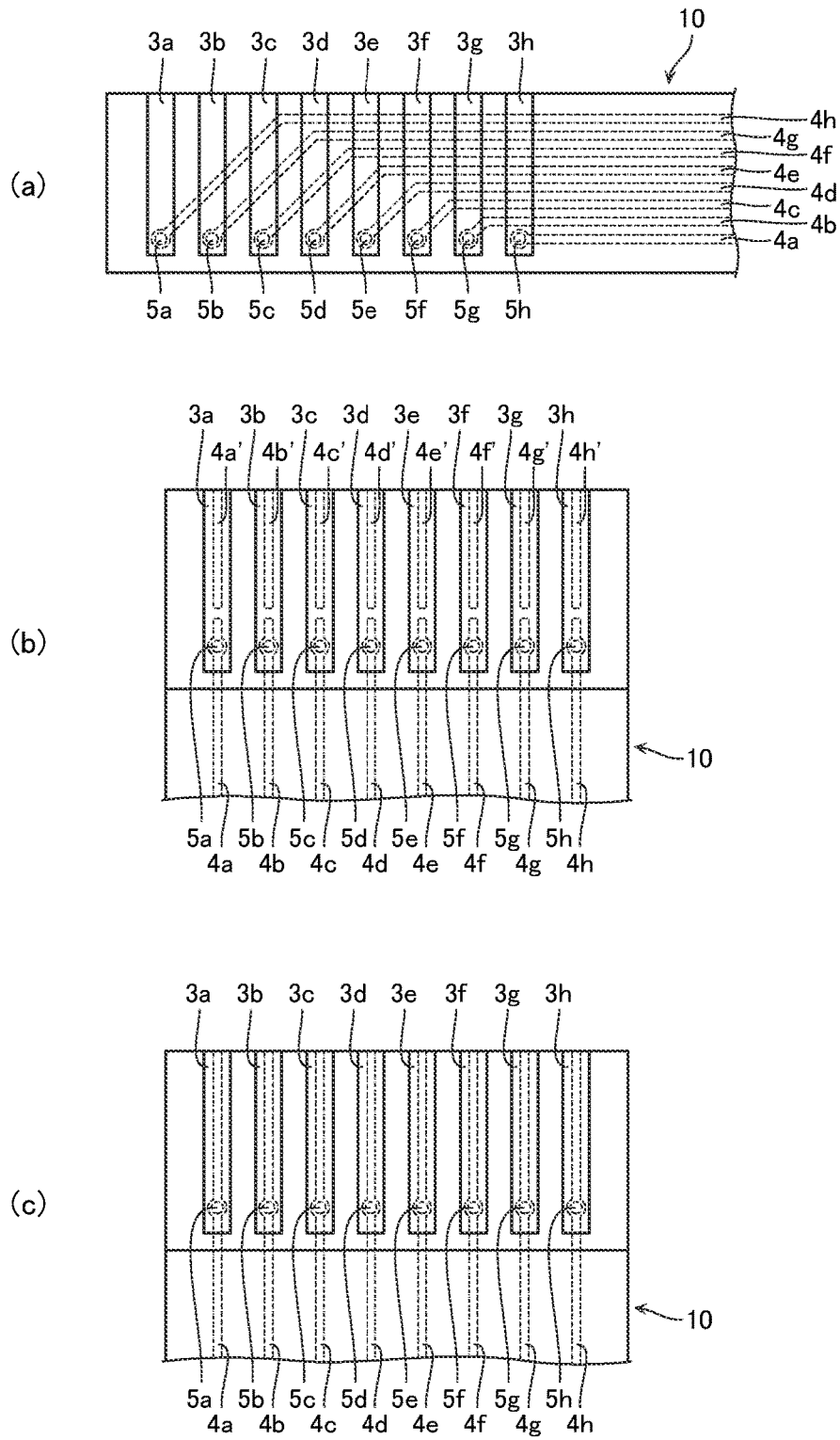
FIGS. 6(a) to 6(c) are plan views showing the flexible printed board according to a fifth embodiment of the present invention.

FIG. 6 is a plan view showing the flexible printed board according to the fifth embodiment of the present invention and FIGS. 6(a), 6(b), and 6(c) show the F-THs 5a to 5h in the same formation positions. More specifically, the F-THs 5a to 5h are arranged linearly along the adjacent direction of arrangement (width direction) of the connection terminals 3a to 3h.

Thus, the FPC 10 according to the fifth embodiment is different from the FPC 10 in the first to fourth embodiments in that the formation positions of the F-THs 5a to 5h are linear along the adjacent direction of arrangement. In FIG. 6(a), the wires 4b to 4h of the wire portion 4 excluding the wire 4a are formed so as to have portions obliquely intersecting the connection terminals 3a to 3h in plane view in the area corresponding to the terminal portion 3 and to extend in the adjacent direction of arrangement from the area.

In FIGS. 6(b) and 6(c), the wires 4a to 4h are formed so as to extend along the longitudinal direction of the connection terminals 3a to 3h, that is, the wires 4a to 4h are formed so as to extend in parallel with connection terminals 3a to 3h and FIG. 6(b) shows a case in which the dummy wires 4a' to 4h' are included and FIG. 6(c) shows a case in which the dummy wires are not included.

First, the example shown in FIG. 6(a) will be described. As shown in FIG. 6(a), the wires 4a to 4h of the wire portion 4 are formed, as described above, so as to extend from the area corresponding to the terminal portion 3 to one side as shown in FIG. 3(a) along the adjacent direction of arrangement of the connection terminals 3a to 3h of the terminal portion 3. The wire 4a is connected to the connection terminal 3h from below the connection terminal 3h via the F-TH 5h.

The wire 4b extends obliquely with respect to the connection terminal 3g by passing below the connection terminal 3h and is connected to the connection terminal 3g from below the connection terminal 3g via the F-TH 5g. The wires 4c to 4h have similarly portions extending obliquely and are connected to the connection terminals 3f to 3a via the F-THs 5f to 5a. In this manner, the length in the longitudinal direction of the connection terminals 3a to 3h in the FPC 10 can be designed as short as possible.

Next, the example shown in FIG. 6(b) will be described. As shown in FIG. 6(b), the wire 4a extends halfway through the connection terminal 3a along the longitudinal direction of the connection terminal 3a and is connected to the connection terminal 3a via the F-TH 5a. Then, the dummy wire 4a' is formed below the connection terminal 3a across a gap along the connection terminal 3a.

The wires 4b to 4h are similarly connected to the connection terminals 3b to 3h via the F-THs 5b to 5h and the dummy wires 4b' to 4h' are formed below the connection terminals 3b to 3h across a gap along the connection terminals 3b to 3h respectively. In this manner, the flexibility of wiring can be increased by designing the length in the adjacent direction of arrangement of the connection terminals 3a to 3h in the FPC 10 as short as possible and also the occurrence of poor connection can be inhibited to improve connection reliability by uniformly applying a predetermined pressure to the terminal portion 3 during thermal compression bonding.

Next, the example shown in FIG. 6(c) will be described. As shown in FIG. 6(c), the wire 4a extends over the entire area below along the longitudinal direction of the connection terminal 3a and is connected to the connection terminal 3a via the F-TH 5a. The wires 4b to 4h similarly extend over the entire area below the connection terminals 3b to 3h and are connected to the connection terminals 3b to 3h via the F-THs 5b to 5h. Also in this manner, the same operation/effect as that in the case of FIG. 6(b) can be achieved.

In the examples shown in FIG. 6, the F-THs 5a to 5h are arranged linearly along the adjacent direction of arrangement (width direction) of the connection terminals 3a to 3h, but may be formed to arrange, for example, in a direction obliquely intersecting the connection terminals 3a to 3h in plane view.

In the above embodiments, the FPC 10 has a configuration in which the terminal portion 3, the wire portion 4, and the F-THs 5a to 5h can be included in a portion inside the panel outline frame in a compression bonding connection area to a component of, for example, a liquid crystal panel. Thus, the FPC 10 does not need a formation portion of the terminal portion 3 and a formation portion of the wire portion 4 and the F-THs 5a to 5h as separate areas and therefore, the arrangement space can be saved to decrease the overall size while connection reliability is improved.

Example 1

Figure 8:
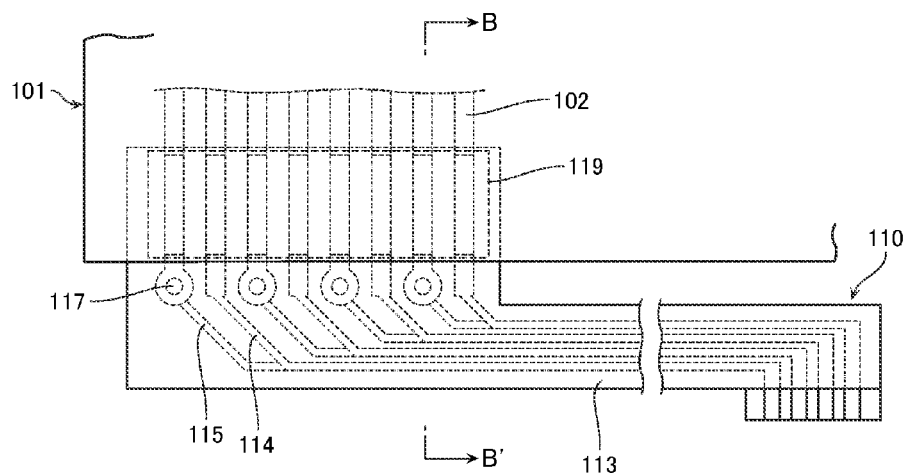
FIG. 8 is a diagram showing a connection structure of a conventional flexible printed board.
Figure 9:
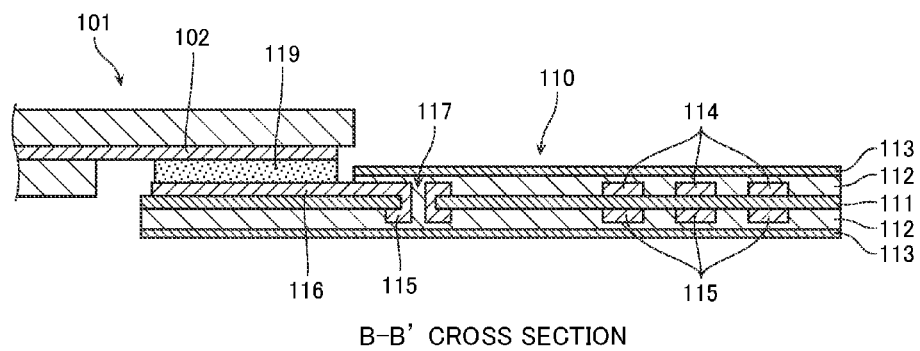
FIG. 9 is a B-B' sectional view of FIG. 8.

Among the FPC 10 according to the second to fourth embodiments, the FPC 10 without the dummy wires 4a' to 4h' from the FPC 10 shown in FIG. 3(a) is produced as Sample A, the FPC 10 shown in FIGS. 3, 4, and 5 are produced as Samples B, C, D respectively, and a flexible printed board in a conventional structure shown in FIGS. 8 and 9 is produced as Sample E.

Continuity tests are conducted by connecting the terminal portion of FPC of the produced Samples A to E to the terminal portion of a test component via ACF as an anisotropic conductive material. The flip-chip bonder "FB30T-M" manufactured by Panasonic Corporation is used as an implementation apparatus and "FP1708E" manufactured by Sony Chemicals Corporation as ACF.

A test component in which all connection terminals of the terminal portion are connected and wires connected respective connection terminals of Samples A to E are connected to measuring pads is used and continuity is checked by allowing a tester to touch the measuring pad corresponding to each connection terminal. As a result, though conduction could not be confirmed for a portion of connection terminals of Sample A, conduction could be confirmed for all structures of the other Samples B to E.

Example 2

Figure 7:
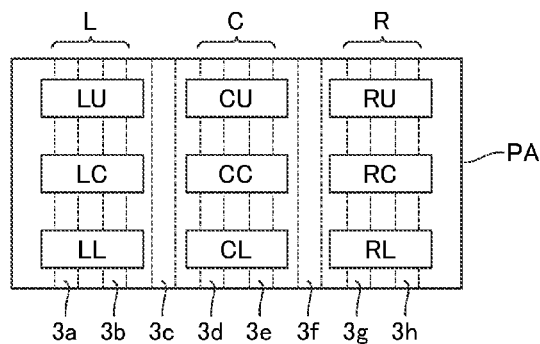
FIG. 7 is a diagram showing measurement points of a compression bonding connection area according to Examples of the second to fourth embodiments of the present invention.

FIG. 7 is a diagram showing measurement points of a compression bonding connection area PA according to Examples of the second to fourth embodiments of the present invention. As shown in FIG. 7, for Samples B to D of above Example 1, the measurement area of the connection terminals 3a, 3b in the compression bonding connection area PA is denoted as L, the measurement area of the connection terminals 3d, 3e is denoted as C, and the measurement area of the connection terminals 3g, 3h is denoted as R.

In each of the measurement areas L, C, R, three different measurement points are provided. More specifically, measurement points LU, LC, LL are provided in the measurement area L, measurement points CU, CC, CL are provided in the measurement area C, and measurement points RU, RC, RL are provided in the measurement area R.

As described above, the FPC 10 in FIG. 3 is denoted as Sample B, the FPC 10 in FIG. 4 is denoted as Sample C, and the FPC 10 in FIG. 5 is denoted as Sample D and Samples B to D are produced as samples corresponding to FIGS. 3(a) to 5(c). Then, for each of Samples B to D, resistance after connection of, among the connection terminals 3a to 3h, the connection terminals 3a, 3b in the measurement area L, the connection terminals 3d, 3e in the measurement area C, and the connection terminals 3g, 3h in the measurement area R is measured by the four-terminal method using "AC mΩ HiTESTER 3560" manufactured by Hioki E.E. Corporation. Measurement results are shown in Tables 1 to 3.

Cross-section observations are made in each measurement point of the measurement areas L, C, R to count the number of deformed conductive particles in ACF between connection terminals to check uniformity of pressure during compression bonding connection. Check results are also shown in Tables 1 to 3. The diameter of conductive particles of ACF is 3.5 μm and the distribution of six conductive particles in average is observed on the terminal in the measurement areas L, C, R having two connection terminals of the width of 80 μm. Among such conductive particles, the number of deformed conductive particles is counted.

TABLE 1

|  | Resistance after connection (Ω) | | | | Number of deformed conductive particles | | |
| --- | --- | --- | --- | --- | --- | --- | --- |
|  | L | C | R |  | L | C | R |
| FIG. 3(a) | 2.427 | 2.043 | 2.386 | U | 0 | 2 | 5 |
|  |  |  |  | C | 1 | 5 | 2 |
|  |  |  |  | L | 5 | 3 | 0 |
| FIG. 3(b) | 2.638 | 2.334 | 2.116 | U | 0 | 2 | 4 |
|  |  |  |  | C | 4 | 4 | 0 |
|  |  |  |  | L | 0 | 1 | 5 |
| FIG. 3(c) | 2.006 | 2.098 | 2.084 | U | 3 | 2 | 3 |
|  |  |  |  | C | 1 | 6 | 1 |
|  |  |  |  | L | 5 | 1 | 5 |

TABLE 2

|  | Resistance after connection (Ω) | | | | Number of deformed conductive particles | | |
| --- | --- | --- | --- | --- | --- | --- | --- |
|  | L | C | R |  | L | C | R |
| FIG. 4(a) | 2.351 | 2.037 | 2.369 | U | 0 | 3 | 6 |
|  |  |  |  | C | 2 | 5 | 1 |
|  |  |  |  | L | 5 | 2 | 0 |
| FIG. 4(b) | 2.813 | 2.325 | 2.107 | U | 0 | 3 | 4 |
|  |  |  |  | C | 3 | 3 | 0 |
|  |  |  |  | L | 0 | 1 | 5 |
| FIG. 4(c) | 2.114 | 1.989 | 2.132 | U | 4 | 2 | 2 |
|  |  |  |  | C | 0 | 6 | 1 |
|  |  |  |  | L | 5 | 2 | 6 |

TABLE 3

|  | Resistance after connection (Ω) | | | | Number of deformed conductive particles | | |
| --- | --- | --- | --- | --- | --- | --- | --- |
|  | L | C | R |  | L | C | R |
| FIG. 5(a) | 2.523 | 2.081 | 2.476 | U | 0 | 2 | 5 |
|  |  |  |  | C | 1 | 6 | 1 |
|  |  |  |  | L | 4 | 2 | 0 |
| FIG. 5(b) | 2.636 | 2.347 | 2.035 | U | 0 | 2 | 4 |
|  |  |  |  | C | 4 | 3 | 0 |
|  |  |  |  | L | 0 | 2 | 6 |
| FIG. 5(c) | 2.011 | 2.102 | 1.999 | U | 4 | 2 | 3 |
|  |  |  |  | C | 0 | 6 | 1 |
|  |  |  |  | L | 6 | 1 | 6 |

Similar measurements are also made using Sample E in a conventional structure for reference comparison. FPC having normal connection terminals not connected to a wire via F-TH as Sample E produces 3.208Ω as the average value of resistance after connecting each of the measurement areas L, C, R. As shown in Tables 1 to 3, this value is larger than any of Samples B to D. Also, a large variation of the resistance value of 20% or more is also confirmed.

In the cross-section observations, the average distribution number of conductive particles was unchanged and six, but at most one deformed conductive particle could be confirmed. Each of Samples B to E has different wire lengths of the wires 4a to 4h due to structure, but the wire resistance measured actually was 0.001Ω or less and was not measurable and thus, the resistance measured actually is determined to be dominated by connection resistance.

For Samples B to D in Tables 1 to 3, FPC including the structures of FIGS. 3(a) to 5(a) produce resistance values of the measurement area C lower than the average value by 10% or more and higher than the average value of resistance of the measurement areas L, R by about 5%. This can be estimated to be caused by the fact that the F-THs 5d, 5e are formed near the connection terminals 3d, 3e of the measurement point CC of the measurement area C in the structure of FIGS. 3(a) to 5(a) and thus, the pressure during compression bonding connection does not escape the number of deformed conductive particles is five and large in the measurement point CC.

On the other hand, for Samples B to D in Tables 1 to 3, FPC including the structures of FIGS. 3(b) to 5(b) produces resistance values 10% higher or more each time of transition from the measurement area R to the measurement area L. This can be estimated to be caused by the fact that with the transition from the measurement area R to the measurement area L, while the F-THs 5g, 5h are near the dispersed measurement points RU, RL, the F-THs 5a, 5b are more concentrated near the measurement point LC in the center and thus, deformed conductive particles increase only near the center of the measurement area L, instead of the entire connection terminals 3a, 3b.

For Samples B to D in Tables 1 to 3, FPC including the structures of FIGS. 3(c) to 5(c) produces resistance values of all the connection terminals 3a, 3b, 3d, 3e, 3g, 3h of the measurement areas L, C, R that fall within the range of ±5% of the average value. This can be estimated to be caused by the fact that the F-THs 5a, 5b, 5d, 5e, 5g, 5h are formed and arranged uniformly in the measurement areas L, C, R the pressure during compression bonding connection is not dispersed.

From the above results, the wires 4a to 4h of the FPC 10 to be connected to the LCD 101, a touch panel or the like are signal lines that are not required to have low resistance and stable sensitivity can be obtained if the resistance value varies within the range of ±5% and therefore, the FPC 10 of the structure in which the F-THs 5a to 5h are randomly arranged like the structures in FIGS. 3(c) to 5(c) is considered to be the most desirable.

The FPC 10 connected to the LCD 101, a touch panel or the like may have a structure in which, in addition to the terminal portion 3, only one connector like the connector portion 6 is sufficient and in this case, the structure in FIG. 3(c) in which the wires 4a to 4h of the wire portion 4 extend to one side of the area corresponding to the terminal portion 3 can be considered to be the most excellent. In addition, when two connectors are needed, the structure in FIGS. 4(c) and 5(c) can be considered to be excellent. Then, the array structure shown in FIG. 4 may be adopted if the inter-wire pitch of the wires 4a to 4h of the wire portion 4 should be relaxed and the array structure shown in FIG. 5 may be adopted if the outline of the FPC 10 should be made smaller.

DESCRIPTION OF REFERENCE NUMERALS

1 Flexible substrate
2 Adhesive agent
3 Terminal portion
3a to 3h Connection terminal
4 Wire portion
4a to 4h Wire
4a' to 4h' Dummy wire
5a to 5h Filled through hole (F-TH)
6 Connector portion
7 Cover lay
10 Flexible printed board (FPC)
101 Liquid crystal panel (LCD)
102 LCD terminal portion
102a to 102h LCD terminal

The invention claimed is:

1. A flexible printed board electrically connected to an electronic component by thermal compression bonding, the flexible printed board comprising:
   a flexible substrate;
   a terminal portion formed on one surface of the flexible substrate and having a plurality of connection terminals to be connected to the electronic component;
   a wire portion having a plurality of wires formed on an other surface of the flexible substrate located opposite to the one surface; and
   a plurality of through wires formed inside through holes penetrating the flexible substrate in a compression bonding connection area of the terminal portion compression-bonded to the electronic component, the plurality of through wires connecting the connection terminals of the terminal portion to the respective wires of the wire portion,
   the through wires being arranged in mutually different positions in a direction in which the plurality of connection terminals extend and a perpendicular thereto,
   wherein the wire portion is formed such that the wires extend in a direction intersecting the connection terminals and such that the wires located between the connection terminals arranged adjacently to each other are equal in number in plan view for each pair of the connection terminals adjacent to each other in the area corresponding to the terminal portion, the number being equal to or more than one.

2. The flexible printed board according to claim 1, wherein
   the wire portion is formed such that the plurality of wires is arranged in an area on the other surface corresponding to the terminal portion on the one surface such that the plurality of wires support substantial part of the plurality of connection terminals.

3. The flexible printed board according to claim 1, wherein
   the wire portion is formed so as to extend from the area corresponding to the terminal portion to both sides along a direction in which the connection terminals of the terminal portion are arranged side-by-side.

4. The flexible printed board according to claim 1, wherein
   the wire portion has the wires extending in a direction parallel to the connection terminals.

5. The flexible printed board according to claim 1, wherein
   the terminal portion is connected to the electronic component via an anisotropic conductive material.

6. The flexible printed board according to claim 1, wherein the wire portion has dummy wires in a portion of the plurality of wires.

* * * * *